United States Patent
Lin

(10) Patent No.: US 7,538,592 B2
(45) Date of Patent: May 26, 2009

(54) PULSE CONTROLLER WITH DUAL LATCHES

(75) Inventor: Kuo-Fan Lin, Taoyuan Hsien (TW)

(73) Assignee: SPI Electronic Co., Ltd., Taoyuan Hsien (TW)

( * ) Notice: Subject to any disclaimer, the term of this patent is extended or adjusted under 35 U.S.C. 154(b) by 167 days.

(21) Appl. No.: 11/599,444

(22) Filed: Nov. 15, 2006

(65) Prior Publication Data

US 2008/0111603 A1    May 15, 2008

(51) Int. Cl.
*H03K 3/017*    (2006.01)
*H03K 5/04*    (2006.01)
*H03K 7/08*    (2006.01)

(52) U.S. Cl. ......................................... 327/175; 327/35
(58) Field of Classification Search ......... 327/172–176, 327/35–38
See application file for complete search history.

(56) References Cited

U.S. PATENT DOCUMENTS 6,069,839 A * 5/2000 Pancholy et al. ....... 365/233.16
6,107,851 A * 8/2000 Balakirshnan et al. ...... 327/172

FOREIGN PATENT DOCUMENTS

TW    501830    9/2002

* cited by examiner

Primary Examiner—Tuan Lam
Assistant Examiner—Diana J Cheng
(74) Attorney, Agent, or Firm—Muncy, Geissler, Olds & Lowe, PLLC

(57) ABSTRACT

A pulse controller with dual latches includes a first latch unit and a second latch unit, in which two latch units are used to latch signal level for ensuring a sufficient conducting amount of the switching element in the rear end power output unit, and through a mutual interaction between the first and the second latch units, a complementary turning-on and turning-off situation therebetween is formed, and further, the signal from a trigger signal source and the feedback from the power output unit are employed to generate the duty cycle signal for the power output unit so as to replace the conventional pulse width modulation circuit.

8 Claims, 4 Drawing Sheets

PULSE CONTROLLER WITH DUAL LATCHES

FIELD OF THE INVENTION

The present invention is related to a pulse controller with dual latches, and more particularly to a pulse controller which utilizes two latch circuits to send out high level and low level duty cycles.

BACKGROUND OF THE INVENTION

In the conventional power supplier, a series of rectifier, filter and clamp circuit are used to convert the power into DC output at specific voltage for providing to equipments, like computer. However, this architecture has a low efficiency and always causes at least 40% electricity loss so that it is hard to provide precise current or voltage. Then, owing to technical advancement, electronic components are used to modulate high-frequency switch element and duty cycle so that the main product of power supplier in the market can have the efficiency up to 80%. The basic method for using PMW (Pulse Width Modulation) to control duty cycle is to utilize an IC with built-in PWM circuit. However, since the price of IC is expensive, other low cost circuit architectures are developed for instead.

For example, a pulse control constituted by latch circuit is disclosed in R.O.C Patent Publication 501830 "improved switch power supplier", wherein the pulse width modulation circuit (44) namely employs a latch circuit to be the switch for substituting the pulse controller chip to control the duty cycle of back-end assistant power source. But, this method still has inconvincible problems. First, the conduction of latch circuit relies on the pulse from the frontend circuit so that the latch circuit lacks of suitable bias voltage for maintaining the conduction, and after the latch circuit is conducted, it will only transmit the pulse signal to the back-end MOSFET, which controls the output of the assistant power source, so that the MOSFET can only maintain the conduction through gate capacitor after being triggered so as to cause insufficient conducting amount. Therefore, in other words, the MOSFET only maintains in the threshold range of "just enough for conduction" so that the stability is insufficient and the MOSFET might be easily error triggered due to the floating gate potential. On the other hand, since temperature variation may vary the current conducting amount of electronic component and the single latch circuit lacks of temperature compensating mechanism, the temperature variation may cause the electronic component to generate leakage current and also the latch circuit or MOSFET to be triggered erroneously; further, because the latch circuit architecture does not include surge noise interference device, it is also easy to cause error trigger; and besides, the latch circuit has a mechanism for limiting maximum duty cycle which also causes the assistant power system to become unstable when heavy load.

Consequently, although replacing the pulse controller chip by one latch circuit can reduce production cost, the latch circuit still has some problems need to solve.

SUMMARY OF THE INVENTION

The object of the present invention is to provide a stable circuit architecture to replace the conventional pulse controller chip for solving the above-described various situations relating error trigger caused from insufficient conducting amount.

Another object of the present invention is to provide a pulse controller which can achieve a maximum duty cycle limitation according to loading feedback, voltage signal and trigger signal.

The present invention discloses a pulse controller with dual latches including a first latch unit and a second latch unit, wherein the first and the second latch units are mutually interacted to form a turning-on and turning-off complementary situation therebetween so as to ensure a sufficient conduction amount for the rear end switch element, and a temperature compensating mechanism is further employed for improving stability. In addition, the pulse controller with dual latches receives signal from a trigger signal source and feedback from a rear end power output unit for generating the duty cycle of the power output unit so as to limit the maximum cycle. Therefore, it is capable of replacing the pulse control chip.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DESCRIPTION OF THE PREFERRED EMBODIMENT

Figure 1:
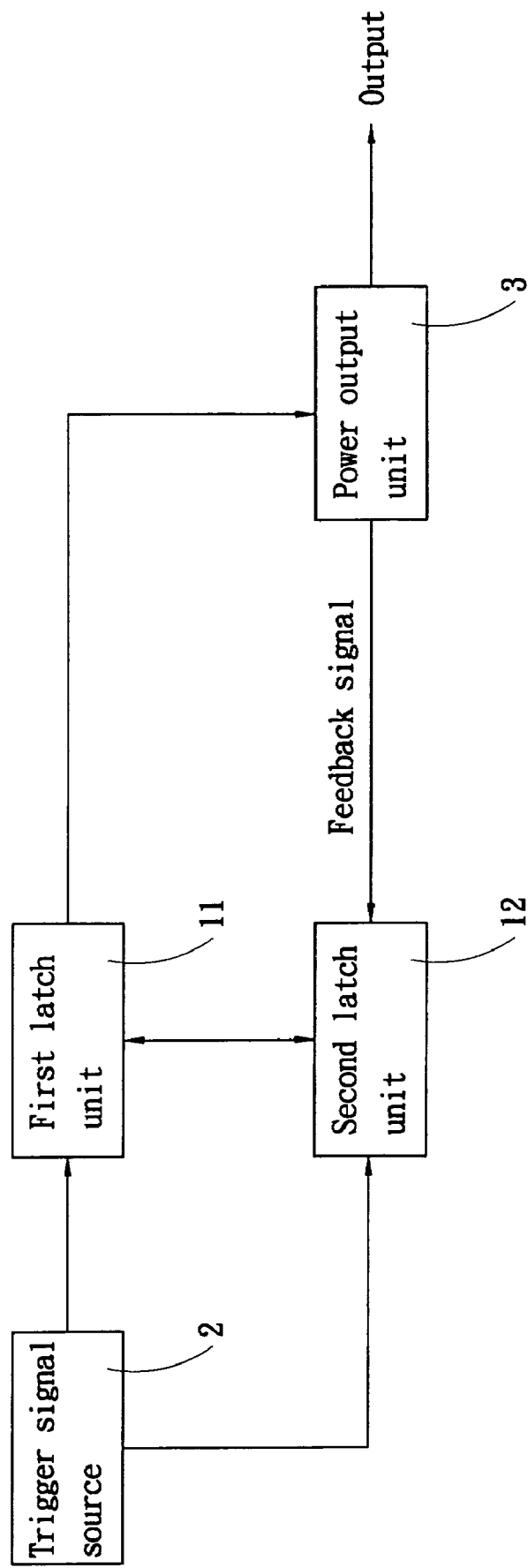
FIG. 1 is a block diagram showing a preferred embodiment of the present invention.

Please refer to FIG. 1, the present invention includes a first latch unit 11 (Latch 1) and a second latch unit (Latch 2), wherein the first latch unit 11 is connected to a power output unit 3 and will output a duty cycle signal (Duty) to the power output unit 3, and then, the power output unit 3 sends a feedback signal to the second latch unit 12 so that the second latch unit 12 can adjust conduction cycle according to the load, and since the voltages of the first and the second latch units 11, 12 are mutually involved, an alternate turning-on and turning-off complementary situation is generated. Moreover, the first and the second latch units can receive the signals from a trigger signal source 2, which will generate an oscillating waveform signal showing the linear voltage ramp waveform with potential difference or a square wave signal with high and low levels, and through the trigger from the waveform outputted by the trigger signal source 2, the first latch unit 11 further drives the power output unit 3, and further, since the power output unit 3 also generates a feedback signal to the second latch unit 12, the first and the second latch units 11, 12 are triggered by the trigger signal from the trigger signal source 2 and the feedback signal from the power output unit 3 so as to have a continuous complementation which causes the output of the first latch unit 11 to be a duty cycle signal with high and low levels.

Figure 2:
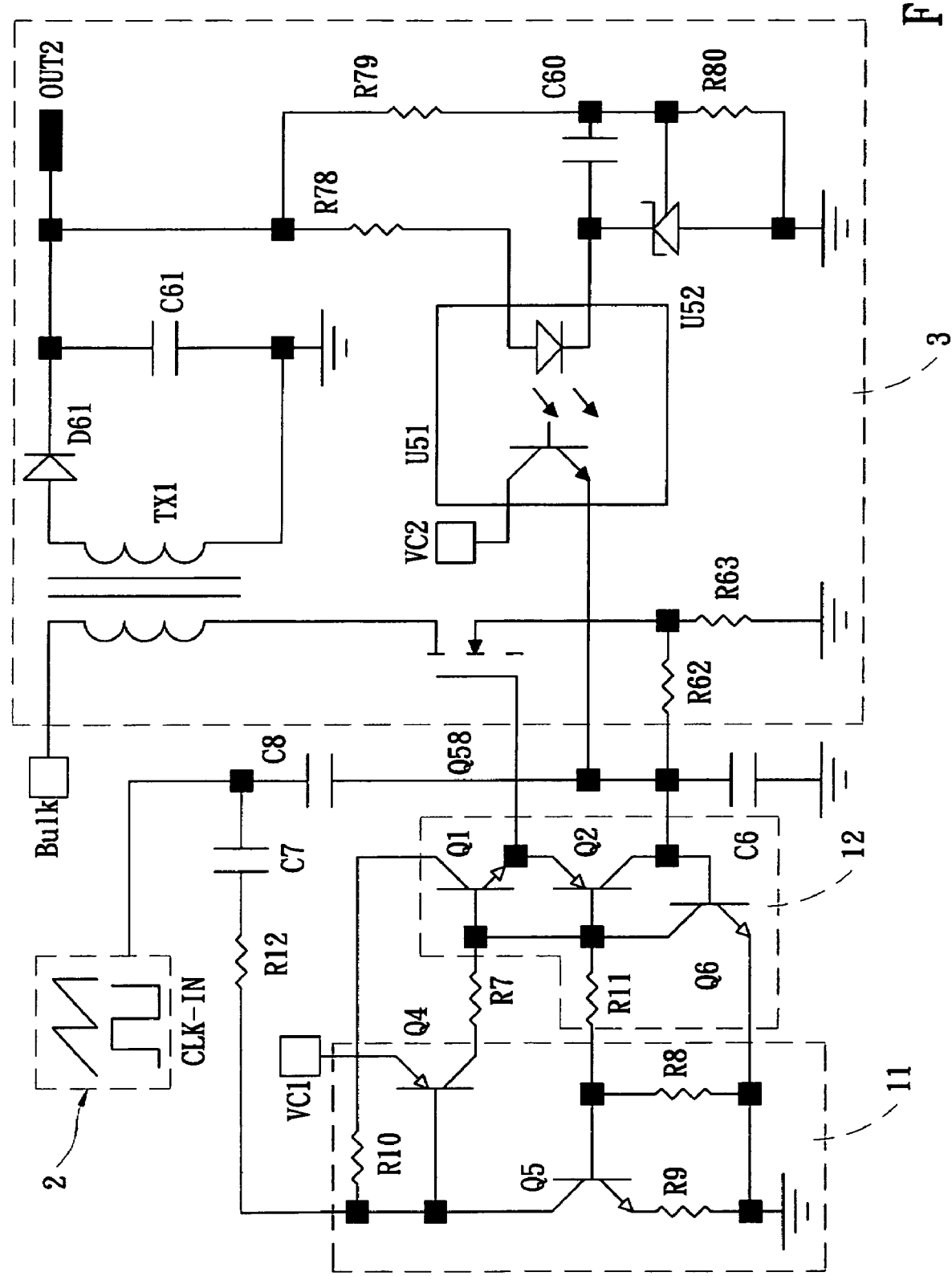
FIG. 2 is a circuit diagram showing a preferred embodiment according to the present invention.
Figure 3:
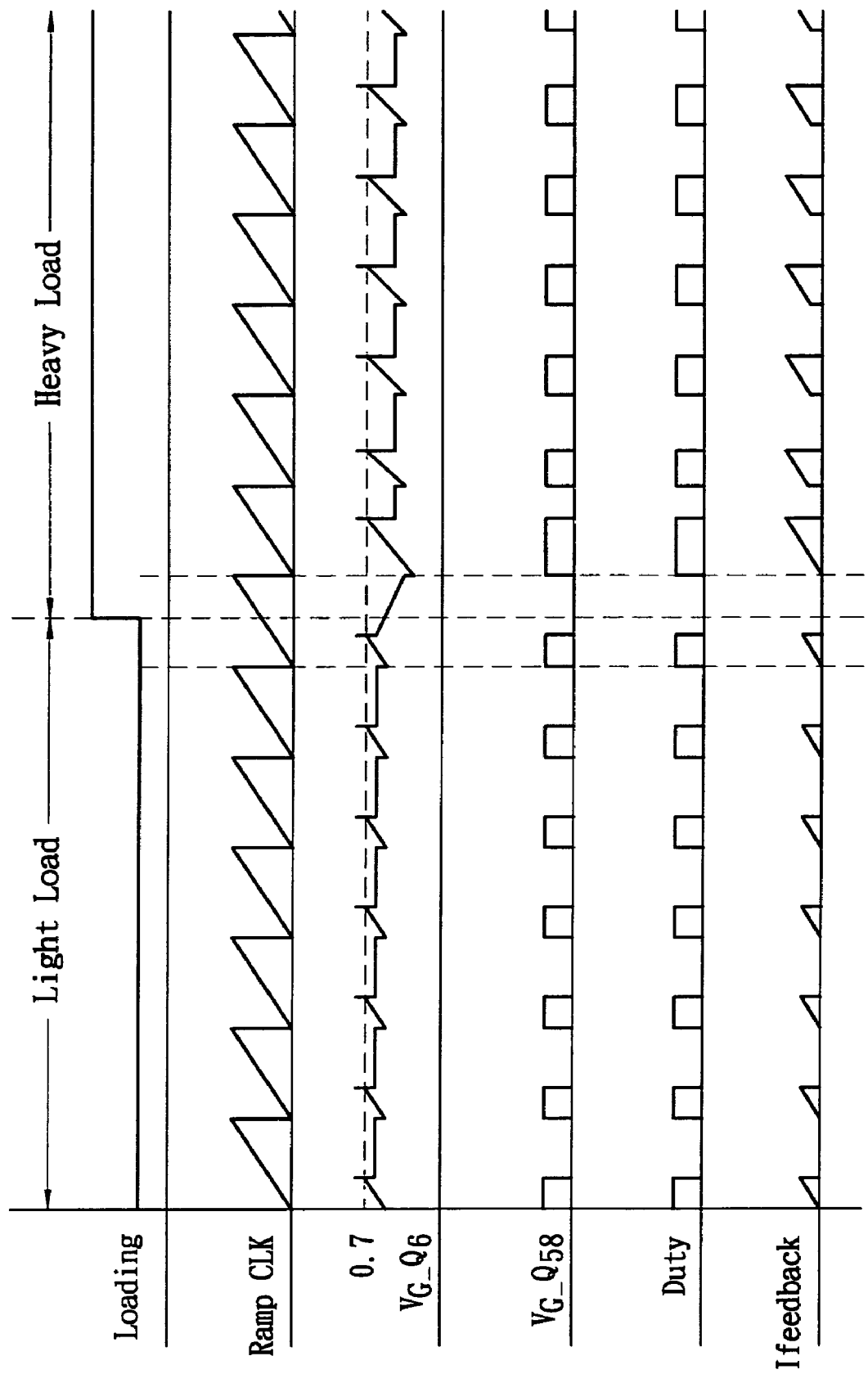
FIG. 3 is a waveform diagram according to a preferred embodiment of the present invention.

Please refer to FIGS. 2 and 3 showing a preferred embodiment according to the present invention. The circuit shown in FIG. 2 includes a first latch unit 11 and a second latch unit 12, wherein the first latch unit 11 and the second latch unit 12 are connected in front and rear. One end of the first and the second latch units 11, 12 is a trigger signal source 2, and the rear end of the first latch unit 11 drives a power output unit 3, and further, the power output unit 3 also includes a circuit for attenuating a signal, which is feedback to the second latch unit 12, from the output terminal (OUT2). When the second latch unit 12 alters working condition, of the first latch unit 11 is also changed so as to generate a complementation. In the embodiment, the trigger signal source 2 generates the oscillating waveform signal of a linear voltage ramp waveform with potential difference (Ramp CLK), the first latch unit 11 mainly includes two transistors Q4, Q5 and bias resistors R8, R9, R10, and the second latch unit 12 is constituted by two transistors Q2, Q3 and bias resistor R11. The signal negative edge of the ramp waveform (Ramp CLK) passes through capacitors C7, C8 so as to conduct Q4 of the first latch unit 11 and turn off Q6 of the second latch unit 12. The potential variation immediately drives Q5 in the first latch unit 11 to conduct of and transistor Q2 of the second latch unit 12 to be turned off, so that the first latch unit 11 is latched and fixed at a high potential and the second latch unit 12 is latched at a low potential which will not be altered until the next trigger or feedback signal is transmitted back, wherein the high potential of the first latch unit 11 may drive the conduction of transistor Q1, so that the transistor Q58 of the rear end power output unit 3 is conducted and the power output unit 3 outputs voltage. The output terminal (OUT2) of the power output unit 3 may utilizes an optical coupling switch U51 to generate a current, which joins with the current bypassed from the primary side of the power output unit 3 to R62 to form as a feedback signal (Ifeedback). The feedback signal gradually increases for generating sufficient potential to conduct the second latch unit 12 and turn off the fist latch unit 11, and the potential variation makes the first and second latch units 11, 12 to have a complementary interaction therebetween which is namely a duty cycle control for the rear end power output unit 3. Referring to the waveforms shown in FIG. 3, the negative edge of the ramp waveform (Ramp CLK) of the oscillating waveform signal transiently reduces and turns off the base voltage (Vb_Q6) of transistor Q6 so as to cause the second latch unit 12 to be low potential and the first latch unit 11 to be high potential. The first latch unit 11 drives the output to the gate (VG_Q58) of the rear end transistor Q58, and the conduction of transistor Q58 causes the primary side of transforming coil (TX1) of the power output unit 3 to conduct and the electricity of the transforming coil (TX1) to be switched to the secondary side. The power output unit 3 simultaneously employs a circuit for bypassing a current from the output terminal (OUT2) so as to gather with the current bypassed from the primary side of the power output unit 3 to R62 to become a feedback signal (Ifeedback). According to the electricity of the transforming coil (TX1) of the power output unit 3 being constantly switched to the output terminal (OUT2), the feedback signal (Ifeedback) gradually raises until the base voltage (Vb_Q6) of the transistor Q6 exceeds the conduction voltage and changes the potential again such that the first and the second latch units 11, 12 once again change their states, thereby forming a duty cycle signal for the rear end power output unit 3. Furthermore, when the load is altered, the feedback signal (Ifeedback) also varies, so that the switching time of the states of the first and the second latch units 11, 12 are also changed and the power output unit 3 may have a duty cycle (Duty) which is adjustable in accordance with the load.

Figure 4:
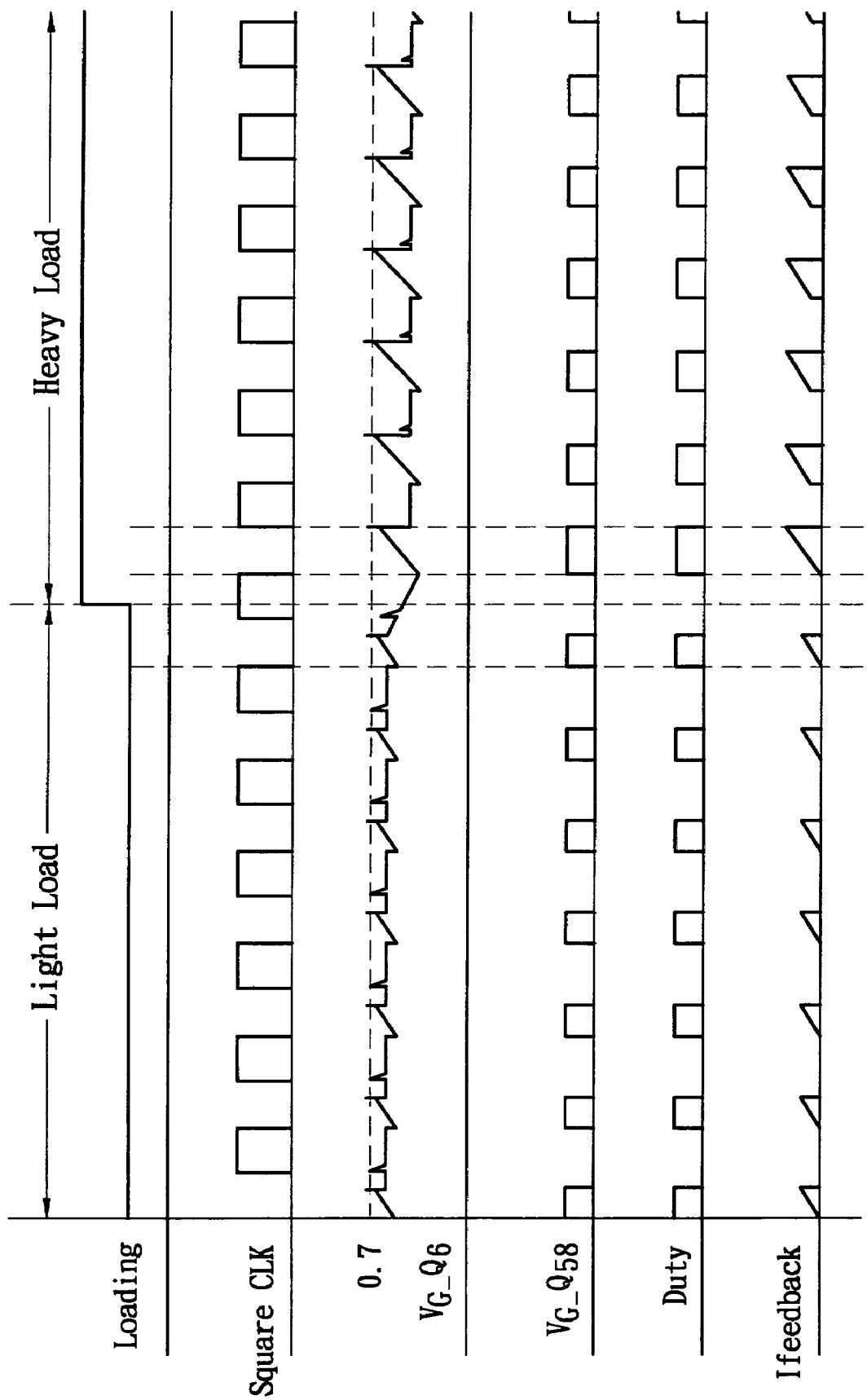
FIG. 4 is a waveform diagram according to another preferred embodiment of the present invention.

Please refer to FIGS. 2 and 4 showing another embodiment of the present invention, the dual-latch pulse controller of the present invention also receives square wave trigger signal (Square CLK), so that in this embodiment, the trigger signal source 2 produces a square wave signal. The negative edge of the square wave (Square CLK) and the negative edge of the ramp waveform identically have the function of altering the states of the first and the second latch units 11, 12 via turning off the transistor Q6. The positive edge of the square wave generates a surge wave, at the base of the transistor Q6, capable of turning off the transistor Q6, and the meaning is when the load is overweighted, although the lower feedback of the power output unit 3 elongates the high level output of the first latch unit 11, the positive edge of the square signal also can trigger the second latch unit 12 so that the output cycle of the first latch unit will not be elongated unlimitedly. In other words, the positive edge of the square wave signal generates a maximum range of duty cycle for achieving the maximum cycle limitation. Furthermore, the first and the second latch units 11, 12 also can include a temperature compensating element, such as the resistor R7 shown in FIG. 2, for limiting the floating range of current owing to the temperature in a receptible scope so as to avoid the first and the second latch units 11, 12 from error actions. Advantageously, the source of the square wave as described above can be a timing signal source which outputs square wave, and further, plural capacitors C6, C7, C8 can be connected around the first and the second latch units 11, 12 for eliminating the noises at the front edge of the trigger signal and the feedback signal so as to improve stability, and thus, the pulse controller with dual latches according to the present invention can replace a pulse controller chip to effectively control the output cycle of the rear end power source.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A pulse controller with dual latches in which two sets of latch units are used to receive a signal from a trigger signal source and a feedback from a rear end power output unit so as to generate a duty cycle of the power output unit, the pulse controller comprising:

a first latch unit having a low level and a high level working states, wherein when the first latch unit is triggered, the original working state thereof is switched to one of the low level and the high level working states and maintained until being triggered again; and a second latch unit having a low level and a high level working states, wherein the working states of the second latch unit and the first latch unit are different but switched at the same time so as to form a complementary relationship therebetween, and wherein when the second latch unit is triggered, the first latch unit is driven to release voltage so as to latch the output at low level, and when the second latch unit receives the signal form the trigger signal source and the feedback from the power output unit, the first latch unit is driven to latch or release voltage level, thereby the complementary relationship between the first and the second latch units forms a duty cycle with low and high levels for controlling the power output unit;

wherein a temperature compensating element is further included between the first and the second latch units.

2. The pulse controller with dual latches as claimed in claim 1, wherein the temperature compensating element is a resistor.

3. The pulse controller with dual latches as claimed in claim 1, wherein the trigger signal source generates an oscillating waveform signal of a linear voltage ramp waveform with potential difference.

4. The pulse controller with dual latches as claimed in claim 3, wherein die second latch unit is triggered by the negative edge of the oscillating waveform signal of the linear voltage ramp waveform for releasing voltage level.

5. The pulse controller with dual latches as claimed in claim 1, wherein the trigger signal source generates a square wave signal having high and low levels.

6. The pulse controller with dual latches as claimed in claim 5, wherein the second latch unit is triggered by the positive and negative edges of the square wave signal to latch or release voltage level.

7. The pulse controller with dual latches as claimed in claim 1, further comprising a plurality of capacitors for preventing noise interference at the front edges of signals from the trigger signal source and the power output unit.

8. The pulse controller with dual latches as claimed in claim 1, wherein the trigger signal source is a timing signal source.

* * * * *